United States Patent
White et al.

(10) Patent No.: US 6,342,313 B1
(45) Date of Patent: *Jan. 29, 2002

(54) OXIDE FILMS AND PROCESS FOR PREPARING SAME

(75) Inventors: Henry W. White, Columbia, MO (US); Shen Zhu, Huntsville, AL (US); Yungryel Ryu, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/439,529

(22) Filed: Nov. 12, 1999

Related U.S. Application Data

(63) Continuation-in-part of application No. 09/364,809, filed on Jul. 30, 1999, which is a continuation-in-part of application No. 09/128,516, filed on Aug. 3, 1998, now Pat. No. 6,291,085.

(51) Int. Cl.$^7$ .............................. B32B 19/00; B32B 9/00
(52) U.S. Cl. ........................ 428/701; 428/699; 428/697; 428/702; 428/469; 428/471
(58) Field of Search ................................ 428/689, 699, 428/700, 701, 702, 469, 471, 697

(56) References Cited

U.S. PATENT DOCUMENTS

| | | | |
|---|---|---|---|
| 3,713,822 A | * 1/1973 | Kiess | 96/1.5 |
| 5,248,631 A | 9/1993 | Park et al. | 437/105 |
| 5,574,296 A | 11/1996 | Park et al. | 257/103 |
| 5,679,965 A | 10/1997 | Schetzina | 257/103 |
| 6,057,561 A | * 5/2000 | Kawasaki et al. | 257/94 |

OTHER PUBLICATIONS

V. Craciun, et al., Growth of ZnO thin films on GaAs by pulsed laser deposition, (1995),Thin Solid Films 259, pp. 1–4.
K. Minegishi, et al., Growth of p–type Zinc Oxide Films by Chemical Vapor Deposition, (1997), Jpn. J Appl. Phys. vol. 36, pp L1453–L1455.
M. Hiramatsu, et al., Transparent conduction ZnO thin films prepared by XeCl excimer laser ablation, (1997), J. Vac. Sci. Technol., pp. 669–673.
PCT/US 99/17486, International Search Report.
Bagnall, D. M., et al., "Optically pumped lasing of ZnO at room temperature," Appl. Phys. Lett., 70 pp. 2230–2232, Apr. 28, 1997.
Gunshor, Robert L., et al., "Blue–green laser–diode technology moves ahead," Laser Focus World, pp. 97–100, Mar. 1995.
Hiramatsu, Mineo, et al., "Transparent conduction ZnO thin films prepared by XeCl excimer laser ablation," J. Vac. Sci. Technol. A, 16(2), pp. 669–673, Mar./Apr. 1998.
Mingegishi, Kazunori, et al., "Growth of p–type Zinc Oxide Films by Chemical Vapor Deposition," Jpn. J. Appl. Phys., vol. 36, No. 11A, pp. 1453–1455, 1997.

(List continued on next page.)

*Primary Examiner*—Deborah Jones
*Assistant Examiner*—Jason de la Pena
(74) *Attorney, Agent, or Firm*—Senniger, Powers, Leavitt & Roedel

(57) ABSTRACT

A p-type oxide film and a process for preparing the film and p-n or n-p junctions is disclosed. In a preferred embodiment, a p-type zinc oxide film contains arsenic and is grown on a gallium arsenide substrate. The p-type oxide film has a net acceptor concentration of at least about $10^{15}$ acceptors/cm$^3$, a resistivity of no greater than about 1 ohm-cm, and a Hall mobility of between about 0.1 and about 50 cm$^2$/Vs.

13 Claims, 9 Drawing Sheets

OTHER PUBLICATIONS

Mohammad, S. N., et al., "Reactive Molecular–Beam Epitaxy for Wurtzite GaN," MRS Bulletin, pp. 22–28, Feb. 1997.

Nakamura, Shuji, "Blue–Green Ligh–Emitting Diodes and Violet Laser Diodes," MRS Bulletin, pp. 29–35, Feb. 1997.

Pearton, Stephen J., et al., "GaN and Related Materials for Device Applications," MRS Bulletin, pp. 17–21, Feb. 1997.

Ohtomo, A., et al., "$Mg_xZn_{1-x}O$ as a II–VI widegap semiconductor alloy," Applied Physics Letters, vol. 72, No. 19, pp. 2466–2468, May 11, 1998.

Ponce, F.A., "Defects and Interfaces in GaN Epitaxy," MRS Bulletin, pp. 51–57, Feb. 1997.

Reynolds, D.C., et al., "Similarities In The Bandedge And Deep–Centre Photoluminescence Mechanisms of ZnO and GaN," Solid State Communications, vol. 101, No. 9, pp. 643–646, 1997.

Shur, Michael S., et al., "GaN/AlGaN Heterostructure Devices: Photodetectors and Field–Effect Transistors," MRS Bulletin, pp. 44–50, Feb. 1997.

Zolper, J.C., et al., "Implantation and Dry Etching of Group–III–Nitride Semiconductors," MRS Bulletin, pp. 36–43, Feb. 1997.

* cited by examiner

FIG. 2  PL: ZnO VS p-ZnO:As AT 20 K 0.5 μm 0.5 μm

FIG. 6

Table 1. Electrical properties of Al-doped ZnO on $Al_2O_3$, measured by the Van der Pauw method. The column headings are, respectively from left to right, magnetic field in units of Gauss, Hall coefficient in units of $cm^3$/Coulomb, resistivity in units of Ohm-cm, density of carriers in units of $cm^{-3}$, carrier mobility in units of cm2/volt-sec, and sample temperature in units of Kelvin.

| Field (Gauss) | Hall Coefficient ($cm^3$/Coulomb) | Resistivity (Ohm-cm) | Carrier Density ($cm^{-3}$) | Mobility ($cm^2$/volt-sec) | Temperature (Kelvin) |
|---|---|---|---|---|---|
| 5004 | -1.13 | 1.03 | $-5.52 \times 10^{18}$ | -1.09 | 290 |
| 4002 | -1.07 | 1.03 | $-5.81 \times 10^{18}$ | -1.04 | 290 |
| 3001 | -1.13 | 1.03 | $-5.53 \times 10^{18}$ | -1.09 | 290 |
| 1998 | -1.32 | 1.03 | $-4.74 \times 10^{18}$ | -1.27 | 290 |
| 1001 | -1.50 | 1.03 | $-4.16 \times 10^{18}$ | -1.45 | 290 |

A CROSS SECTION OF A ZnO P-N JUNCTION

OXIDE FILMS AND PROCESS FOR PREPARING SAME

This application is a continuation-in-part application of application Ser. No. 09/364,809 filed on Jul. 30, 1999 which is a continuation-in-part application of application Ser. No. 09/128,516 filed on Aug. 3, 1998 now U.S. Pat. No. 6,291,085.

This invention was made with Government support under Grant/Project Number DAAH04-94-G-0305 awarded by the Army Research Office. The Government may have certain rights in the invention.

BACKGROUND OF THE INVENTION

This invention is directed to oxide films, such as zinc oxide (ZnO) films, for use in electrically excited devices such as light emitting devices (LEDs), laser diodes (LDs), field effect transistors (FETs), photodetectors, and transducers. More particularly, this invention is directed to oxide films containing a p-type dopant for use in LEDs, LDs, FETs, and photodetectors wherein both n-type and p-type materials are required, for use as a substrate material for lattice matching to other materials in such devices, and for use as a layer for attaching electrical leads.

For some time there has been interest in producing wide band gap semiconductors to produce green/blue LEDs, LDs and other electrical devices. Historically, attempts to produce these devices have centered around zinc selenide (ZnSe) or gallium nitride (GaN) based technologies. However, these approaches have not been entirely satisfactory due to the short lifetime of light emission that results from defects, and defect migration, in these devices.

Recently, because ZnO has a wide direct band gap of 3.3 eV at room temperature and provides a strong emission source of ultraviolet light, ZnO thin films on suitable supporting substrates have been proposed as new materials for light emitting devices and laser diodes. Undoped, as well as doped ZnO films generally show n-type conduction. Impurities such as aluminum and gallium in ZnO films have been studied by Hiramatsu et al. who report activity as n-type donors (*Transparent Conduction Zinc Oxide Thin Films Prepared by XeCl Excimer Laser Ablation*, J. Vac. Sci. Technol. A 16(2), March/April 1998). Although n-type ZnO films have been available for some time, the growth of p-type ZnO films necessary to build many electrical devices requiring p-n junctions has to date been much slower in developing.

Minegishi et al. (*Growth of P-Type ZnO Films by Chemical Vapor Deposition*, Jpn. J. Appl. Phys. Vol. 36 Pt. 2, No. 11A (1997)) recently reported on the growth of nitrogen doped ZnO films by chemical vapor deposition and on the p-type conduction of ZnO films at room temperature. Minegishi et al. disclose the growth of p-type ZnO films on a sapphire substrate by the simultaneous addition of NEW in carrier hydrogen and excess Zn in source ZnO powder. When a Zn/ZnO ratio of 10 mol % was used, secondary ion mass spectrometry (SIMS) confirmed the incorporation of nitrogen into the ZnO film, although the nitrogen concentration was not precisely confirmed. Although the films prepared by Minegishi et al. using a Zn/ZnO ratio of 10 mol % appear to incorporate a small amount of nitrogen into the ZnO film and convert the conduction to p-type, the resistivity of these films is too high for application in commercial devices such as LEDs or LDs. Also, Minegishi et al. report that the carrier density for the holes is $1.5 \times 10^{16}$ holes/cm$^3$. The combined effect of the low carrier density for holes and the high value for the resistivity does not permit this material to be used in commercial light emitting devices or laser diodes.

Park et al. in U.S. Pat. No. 5,574,296 disclose a method of producing thin films on substrates by doping IIB-VIA semiconductors with group VA free radicals for use in electromagnetic radiation transducers. Specifically, Park et al. describe ZnSe epitaxial thin films doped with nitrogen or oxygen wherein ZnSe thin layers are grown on a GaAs substrate by molecular beam epitaxy. The doping of nitrogen or oxygen is accomplished through the use of a free radical source which is incorporated into the molecular beam epitaxy system. Using nitrogen as the p-type dopant, net acceptor densities up to $4.9 \times 10^{17}$ acceptors/cm$^3$ and resistivities less than 15 ohm-cm were measured in the ZeSe film. The combined effect of the low value for the net acceptor density and the high value for the resistivity does not permit this material to be used in commercial devices such as LEDs, LDs, and FETs.

Although some progress has recently been made in the fabrication of p-type doped oxide films which can be utilized in the formation of p-n junctions, a need still exists in the industry for oxide films which contain higher net acceptor concentrations and possess lower resistivity values.

SUMMARY OF THE INVENTION

Among the objects of the present invention, therefore, are the provision of an oxide film containing a high net acceptor concentration on a substrate; the provision of a process for producing oxide films containing p-type dopants; the provision of a process for producing p-n junctions utilizing an oxide film containing a p-type dopant; the provision of a process for producing homoepitaxial and heteroepitaxial p-n junctions utilizing an oxide film containing a p-type dopant; and the provision of a process for cleaning a substrate prior to growing a film on the substrate.

Briefly, therefore, the present invention is directed to a ZnO film on a substrate wherein the film contains a p-type dopant. The film has a net acceptor concentration of at least about $10^{15}$ acceptors/cm$^3$, a resistivity less than about 1 ohm-cm, and a Hall Mobility of between about 0.1 and about 50 cm$^2$/Vs.

The invention is further directed to a process for growing a p-type ZnO film containing arsenic on a GaAs substrate. The GaAs substrate is first cleaned to ensure that the film will have a reduced number of defects and will properly adhere to the substrate. After cleaning, the temperature of the substrate in the chamber is adjusted to between about 300° C. and about 450° C. and the excimer pulsed laser is directed onto a polycrystalline ZnO crystal to grow a film on the substrate. The temperature of the substrate coated with the film in the deposition chamber is then increased to between about 450° C. and about 600° C. and the substrate is annealed for a time sufficient to diffuse arsenic atoms into the film so as to produce a net acceptor concentration of at least about $10^{15}$ acceptors/cm$^3$ in the film.

The invention is further directed to a process for growing a p-type zinc oxide film on a substrate. The substrate is first cleaned to ensure that the film will have a reduced number of defects and will properly adhere to the substrate. After cleaning the substrate, the temperature of the substrate in the chamber is adjusted to between about 300° C. and about 450° C., and a p-type zinc oxide film is grown on the substrate by directing an excimer pulsed laser beam onto a pressed ZnO powder pellet containing a p-type dopant to grow a p-type zinc oxide film containing a net acceptor concentration of at least about $10^{15}$ acceptors/cm$^3$.

The invention is further directed to a process for preparing a p-n junction having a p-type ZnO film and an n-type film wherein the net acceptor concentration is at least about $10^{15}$ acceptors/cm$^{-3}$. A substrate is loaded into a pulsed laser deposition chamber and cleaned to ensure that the film will have a reduced number of defects and will properly adhere to the substrate. The temperature of the substrate in the deposition chamber is then raised to between about 300° C. and about 450° C. Subsequently a p-type ZnO film having a net acceptor concentration of at least about $10^{15}$ acceptors/cm$^3$ is grown on the substrate by directing an excimer laser onto a pressed ZnO powder pellet containing the p-type dopant. Finally an n-type film is grown on top of the p-type film by directing an excimer laser beam onto a pressed ZnO pellet containing the n-type dopant.

The invention is further directed to a process for preparing a p-n junction having a p-type ZnO film and an n-type film wherein the net acceptor concentration is at least about $10^{15}$ acceptors/cm$^{-3}$. A substrate is loaded into a pulsed laser deposition chamber and cleaned to ensure that the film will have a reduced number of defects and will properly adhere to the substrate. The temperature of the substrate in the deposition chamber is then raised to between about 300° C. and about 450° C. Subsequently an n-type film is grown on the substrate by directing an excimer pulsed laser beam onto a pressed powder pellet containing an n-type dopant element. Finally, a p-type ZnO film is grown on the n-type film by directing an excimer pulsed laser beam onto a pressed ZnO powder pellet containing a p-type dopant element to a p-type ZnO film having a net acceptor concentration of at least about $10^{15}$ acceptors/cm$^3$.

The invention is further directed to a process for cleaning a substrate prior to growing a film on the substrate. A substrate is loaded into a chamber, the temperature of the substrate is adjusted to between about 400° C. and about 500° C., and the chamber is filed with hydrogen to create a pressure between about 0.5 and about 3 Torr. The distance between a metal shutter in the chamber and the substrate is adjusted to between about 3 and about 6 centimeters and an excimer pulsed laser having an intensity between about 20 and about 70 mJ and a repetition of between about 10 to about 30 Hz is directed onto the shutter for a period of between about 5 and about 30 minutes to clean the substrate.

The invention is still further directed to a p-type film on a substrate wherein the film contains a p-type dopant element which is the same element as one constituent of the substrate.

The invention is further directed to a process for preparing a p-n junction having a p-type ZnO film and an n-type ZnO film on a p-type doped substrate wherein the net acceptor concentration is at least about $10^{15}$ acceptors/cm$^3$. The process comprises adjusting the temperature of the substrate in a pulsed laser deposition chamber to between about 300 and about 450° C. and growing a p-type ZnO film on the substrate by directing an excimer pulsed laser beam onto a pressed ZnO powder pellet containing a p-type dopant and growing an n-type film on top of the p-type film.

The invention is further directed to a process for growing a doped ZnO film on a substrate. The process comprises adjusting the temperature of the substrate in a pulsed laser deposition chamber to between about 300 and about 450° C. and pre-ablating a polycrystalline ZnO crystal. Finally, an excimer pulsed laser beam is directed onto the polycrystalline ZnO crystal to grow a film on the GaAs substrate while a molecular beam containing a dopant is simultaneously directed onto the growing ZnO film for a time sufficient to incorporate at least about $10^{15}$ dopant/cm$^3$.

The invention is still further directed to an oxide film on a substrate. The oxide film contains a p-type dopant and has a net acceptor concentration of at least about $10^{15}$ acceptors/cm$^3$, a resistivity no greater than about 1 ohm-cm, and a Hall Mobility of between about 0.1 and about 50 cm$^2$/Vs.

Other objects and features of this invention will be in part apparent and in part pointed out hereinafter.

BRIEF DESCRIPTION OF THE DRAWINGS

FIG. 6 is a table showing various electrical properties of an aluminum doped ZnO n-type film.

Corresponding reference characters indicate corresponding parts throughout the drawings.

DETAILED DESCRIPTION OF THE PREFERRED EMBODIMENTS

In accordance with the present invention, it has been discovered that oxide films, such as ZnO films, containing high levels of p-type dopants can be grown on substrates utilizing a pulsed laser deposition process alone or in combination with an annealing step. Surprisingly, the p-type dopant level achieved in the oxide film is sufficient to allow the p-type film to be used to form p-n junctions useful in electrical and electroluminescent devices, for use as a substrate material for lattice matching to materials in such devices, and for use as a desirable layer for attaching electrical leads.

Figure 1:
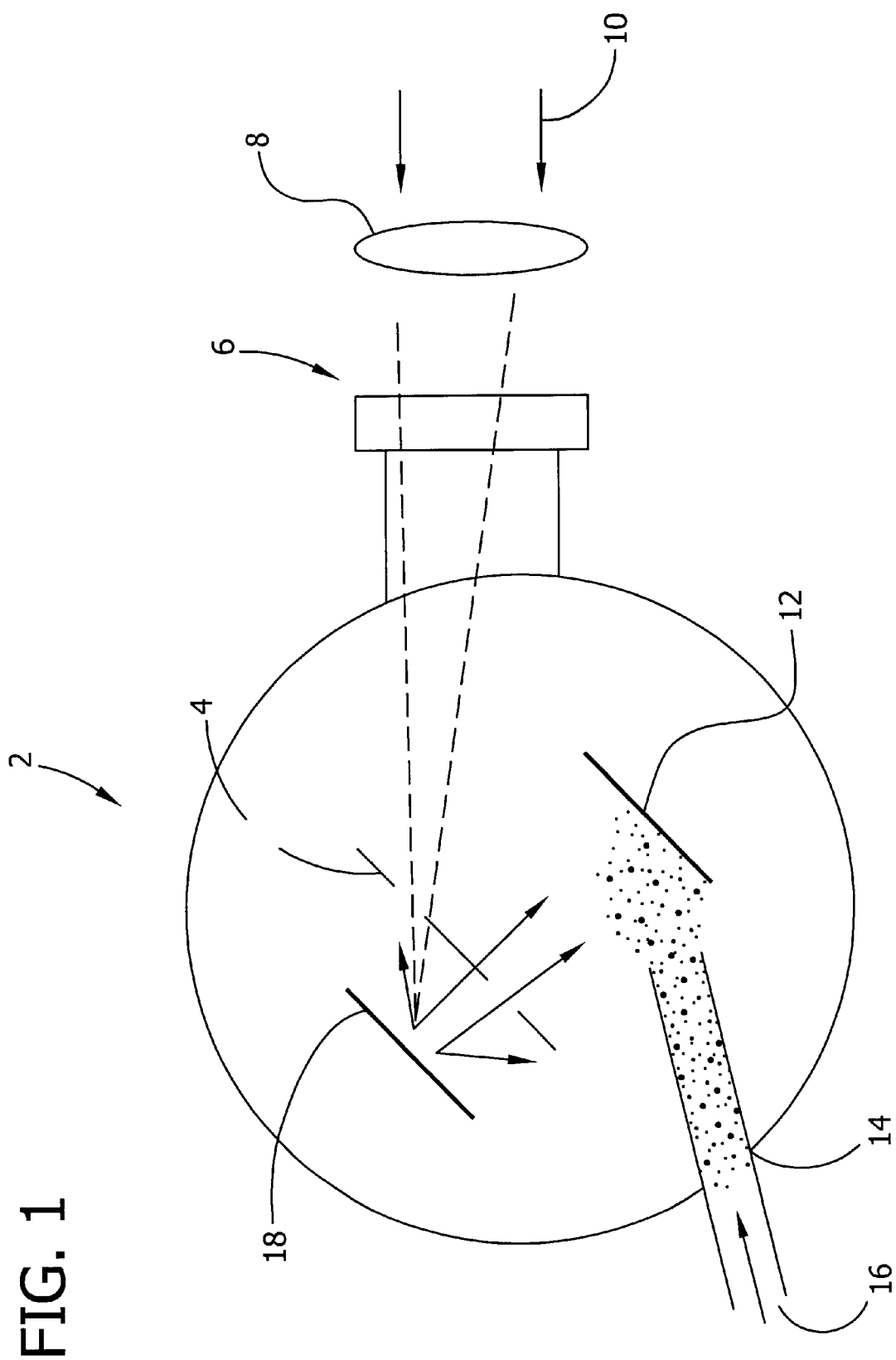
FIG. 1 is a schematic diagram of a pulsed laser deposition system.

Referring now to FIG. 1, there is shown a schematic diagram of a pulsed laser deposition system. Such a system is one method that can be utilized to grow oxide films containing p-type dopants on suitable substrates in accordance with the present invention. Other methods of growing oxide films containing p-type dopants on substrates may include molecular beam epitaxy (MBE), MBE in conjunction with laser ablation, and chemical vapor deposition (CVD). Oxide films that may be grown in accordance with the present invention include oxide compounds of Group 2 (also known as IIA, which includes elements such as Be, Mg, Ca Sr, Ba, and Ra), oxide compounds of Group 12 (also known as IIB, which includes elements such as Zn, Cd and Hg), oxide compounds of Group 2 and Group 12, and oxide compounds of Group 12 and Group 16 (also known as VIA, which includes elements such as O, S, Se, Te and Po).

Examples of suitable oxides include BeO, CaO, SrO, BaO, MgO, CdO, ZnO, $Zn_{1-x}Mg_xO$, $Zn_{1-x}Ba_xO$, $Zn_{1-x}Ca_xO$, $Zn_{1-x}Cd_xO$, $ZnSe_xO_{1-x}$, $ZnS_xO_{1-x}$, and $ZnTe_xO_{1-x}$, with ZnO being most preferred. Suitable p-type dopants for use in the present invention include Group 1 (also known as IA, which includes elements such as Li, Na, K, Rb, and Cs), Group 11 (also known as IB, which includes elements such as Cu, Ag, and Au), Group 5 (also known as VB, which includes elements such as V, Nb, and Ta), and Group 15 (also known as VA, which includes elements such as N, P, Sb, As, and Bi), with arsenic being preferred.

Again referring to FIG. 1, there is shown a focusing lens 8 capable of directing an excimer laser beam 10 through laser window 6 into pulsed laser deposition chamber 2. The beam 10 can be directed onto either metal shutter 4 or target 18 depending upon the desired processing step. The beam 10 impinges on either metal shutter 4 or produces an ablation plume of oxide material from the target 18 and onto substrate 12. During the process of growing oxide films, gas inlet tube 14 allows gas 16 into the chamber 2.

Before growth of the oxide film on the substrate, the substrate should be cleaned in order to remove surface contaminants such as oxygen and carbon to minimize the number of defects in the film and to ensure maximum adherence of the film to the substrate. Conventional substrate cleaning techniques including wet chemical treatments, thermal cleaning, hydrogen atom plasma treatments, or any combination thereof can be used to sufficiently clean the substrate surface. In addition, a pulsed excimer laser, such as a pulsed argon fluoride excimer laser, can be used to clean the substrate in situ.

To clean the substrate using a pulsed excimer laser, the temperature of the substrate in the pulsed laser deposition chamber 2 is first adjusted to between about 300° C. and about 600° C., more preferably between about 400° C. and about 500° C., most preferably to about 450° C., and the chamber 2 is filled with a gas such as hydrogen to create a pressure of between about 0.5 and about 3 Torr, preferably between about 1 to about 2 Torr. Referring again to FIG. 1, a metal shutter 4, which may be made from iron, for example, is inserted between the target 18 and the substrate 12 such that the substrate is positioned between about 3 and about 6 centimeters, preferably about 4 centimeters, in front of the metal shutter 4. The focusing lens 8 is removed from the system, and an excimer laser beam 10, such as an argon fluoride excimer laser beam having an intensity of between about 20 and about 70 mJ, preferably about 50 mJ and a repetition rate of about 10 to about 30 Hz, preferably about 20 Hz, is directed into the chamber 2 and onto the metal shutter 4 for a period of between about 5 and about 30 minutes, preferably about 10 minutes.

Figure 4:
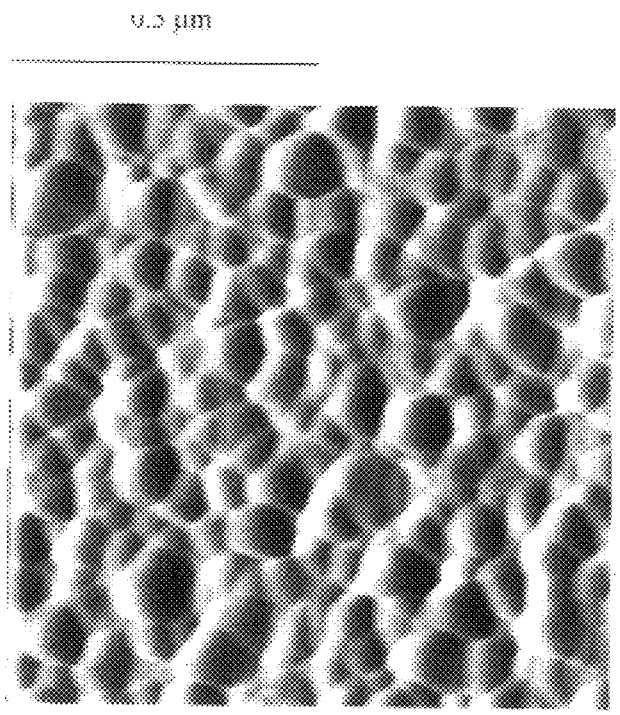
FIG. 4 is an Atomic Force Microscopy image of a ZnSe film on a GaAs substrate wherein the substrate was cleaned using the cleaning process of the present invention.
Figure 5:
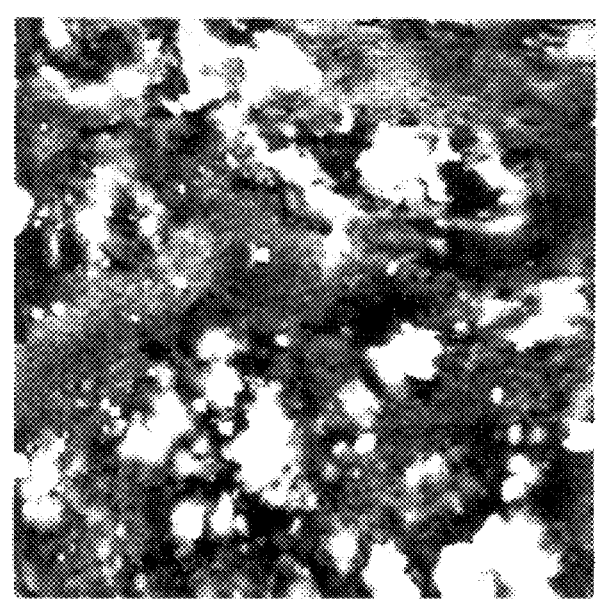
FIG. 5 is an Atomic Force Microscopy image of a ZnSe film on a GaAs substrate wherein the substrate was cleaned using a thermal process.

During this period of illumination of the metal shutter, the laser beam interacts with the metal shutter and creates excited hydrogen atoms, photoelectrons, and photons that effectively remove contaminants from the substrate surface. Using the pulsed excimer laser, the substrate surface can be effectively cleaned at a much lower temperature than that required by conventional techniques. The pulsed excimer laser cleaning process can be effectively utilized to clean GaAs, GaN, sapphire, and other substrates prior to the deposition of oxide films such as ZnO or other films such as ZnSe, GaN. For example, FIGS. 4 and 5 show Atomic Force Microscopy (AFM) images of the surface morphology of a ZnSe film on GaAs substrates. In FIG. 4, the GaAs substrate was cleaned prior to the deposition of the ZnSe film using the cleaning process described above. The deposited ZnSe film has a thickness of about 0.5 micrometers and has only a root mean surface roughness of about 1.05 nanometers. In FIG. 5, the GaAs substrate was cleaned prior to the deposition of the ZnSe film by a thermal treatment process at a substrate temperature of about 570° C. The deposited ZnSe film has a thickness of about 0.5 micrometers and has a root mean surface roughness of about 6.65 nanometers. As indicated in FIGS. 4 and 5, the cleaning process of the present invention leaves a much improved uniform surface for subsequent film growth.

After the period of illumination is complete, the hydrogen gas is pumped out of chamber 2, and the temperature of the substrate is adjusted to between about 200° C. and about 1000° C., preferably between about 250° C. and about 500° C., and most preferably to between about 300° C. and about 450° C., to grow the oxide film.

After the substrate has been cleaned and the temperature in the chamber adjusted, the focusing lens 8 is replaced, the metal shutter 4 is removed and the target is pre-ablated with a pulsed excimer laser having an intensity of between about 20 and about 70 mJ, preferably about 50 mJ, and a repetition rate of between about 10 and about 30 Hz, preferably about 20 Hz for a period of about 10 minutes.

After the pre-ablation is complete, the chamber 2 is filled with oxygen to a pressure of between about $10^{-6}$ Torr and about $10^{-2}$ Torr, preferably about 35 mTorr. The laser beam 10 is directed through focusing lens 8 and laser window 6 onto the target 18 to produce an ablation plume of oxide material, such as ZnO for example, that is adsorbed onto substrate 12. The target 18 is between about 5 and about 20 centimeters, preferably about 7 centimeters from the substrate 12. Suitable targets for use in the present invention include polycrystalline oxide containing compounds such as polycrystalline ZnO, for example, as well as powder pellets, such as ZnO, containing a dopant. Suitable substrates for use in the present invention include gallium arsenide, sapphire, and ZnO. The laser beam 10 can have an intensity of about 90 mJ and a repetition rate of about 20 Hz, for example. The laser beam 10 is directed at the target 18 for a period of about 0.5 to about 4 hours, preferably about 1 to about 2 hours to grow an oxide film on substrate 12 between about 0.5 and about 3 micrometers thick, preferably about 1 micrometer thick.

In a particularly preferred embodiment of the present invention, the target 18 is polycrystalline ZnO, the substrate 12 is gallium arsenide, and the p-type dopant is arsenic. If the growth of the ZnO film on the gallium arsenide substrate as described above occurred at a substrate temperature of at least about 400° C., no further processing steps are necessary, and the ZnO layer will contain a net acceptor concentration of at least about $10^{15}$ acceptors/cm$^3$, preferably at least about $10^{16}$ acceptors/cm$^3$, more preferably at least about $10^{17}$ acceptors/cm$^3$, and more preferably between about $10^{18}$ and about $10^{21}$ acceptors/cm$^3$ as arsenic atoms will migrate from the gallium arsenide substrate into the ZnO film during the film growth at a temperature of at least about 400° C. Additionally, the film will have a resistivity of no more than about 1 ohm-cm, preferably between about 1 and about $10^{-4}$ ohm-cm, and a Hall mobility of between about 0.1 and about 50 cm$^2$/Vs.

If the growth of the oxide film on the gallium arsenide substrate occurs below about 400° C., a further processing step (annealing) is required to diffuse arsenic from the substrate into the oxide film. This annealing step consists of adjusting the temperature of the substrate in the chamber 2 to between about 450° C. and about 600° C., preferably to about 500° C., and filling the chamber 2 with a gas such as oxygen at a pressure between about 0.1 Torr and about 1 atmosphere, preferably about 1 to about 2 Torr. The gallium arsenide substrate is annealed for a period of between about 10 and about 60 minutes, preferably about 20 to about 30 minutes to produce a net acceptor concentration of at least about $10^{15}$ acceptors/cm$^3$, preferably at least about $10^{16}$ acceptors/cm$^3$, more preferably at least about $10^{17}$ acceptors/cm$^3$, and most preferably between about $10^{18}$ acceptors/cm$^3$ and about $10^{21}$ acceptors/cm$^3$ from the substrate 12 into the oxide film.

Without being bound to a particular theory, in the one preferred embodiment when arsenic dopant from a GaAs substrate is caused to diffuse into a ZnO film, superior results are achieved due in substantial part to the fact that the p-type dopant elemental source is the substrate itself. The p-type dopant elemental source is therefore in intimate contact with the film, which facilitates diffusion more efficiently and to a greater degree as compared to processes in which the substrate is not the dopant source. In this particular embodiment, therefore, having the dopant source be the substrate facilitates achieving the improvements in net acceptor concentration, resistivity, and Hall mobility described herein. Also, the cleaning process as described herein utilized with the preferred film growing and annealing processes cleans the GaAs surface extremely well to remove contaminants such as carbon and oxygen without damaging the crystal structure. The clean, non-damaged surface allows the ZnO film to grow with improved crystal alignment and with a reduced number of defects. This cleaning process therefore further facilitates diffusion of arsenic more efficiently and to a greater degree, which results in improvements in structural, optical and electrical properties.

In an alternative embodiment, oxide films containing p-type dopants such as arsenic or n-type dopants such as aluminum can be grown on substrates such as ZnO, GaAs, GaN and sapphire using a process wherein an excimer pulsed laser beam is directed onto a pressed powder pellet comprised of the compound to be grown on the substrate, such as ZnO, while simultaneously directing a molecular beam of arsenic or aluminum onto the growing oxide film from either a thermal evaporation source or an arsenic or aluminum containing gas. The substrate is held at a temperature of between about 200° C. and about 1000° C., preferably between about 300° C. and about 450° C. and is filled with oxygen at a pressure of about $10^{-6}$ Torr and about $10^{-2}$ Torr. A pre-ablation step may be employed on the ZnO target as described above. The combination of the required molecular beam flux and the length of time required for the molecular beam containing the dopant to be directed at the substrate is sufficient to achieve a net acceptor or donor concentration of at least about $10^{15}$/cm$^3$, more preferably at least about $10^{16}$/cm$^3$ still more preferably at least about $10^{17}$/cm$^3$, and still more preferably between about $10^{18}$/cm$^3$ and about $10^{21}$/cm$^3$.

In a further alternative embodiment, oxide films containing p-type dopants such as arsenic on a substrate can be prepared using pressed powder pellets as described above which contain a p-type dopant as the target in the pulsed laser deposition chamber. This process does not require migration of the dopant from the substrate into the film.

An oxide film is grown on a suitable substrate using the pulsed laser deposition method described above except that the target is a pressed oxide powder pellet as described above that contains a small amount of elemental p-type dopant. The amount of dopant, such as arsenic, required in the powder pellet to achieve a net acceptor concentration level of at least about $10^{15}$ acceptors/cm$^3$, preferably at least about $10^{16}$ acceptors/cm$^3$, more preferably at least about $10^{17}$ acceptors/cm$^3$, and still more preferably between about $10^{18}$ acceptors/cm$^3$ and about $10^{21}$ acceptors/cm$^3$ is determined by measuring the amount of dopant in the oxide film and adjusting the dopant level in the powdered pellet until the net acceptor concentration of at least about $10^{15}$ acceptors/cm$^3$, preferably at least about $10^{16}$ acceptors/cm$^3$, still more preferably at least about $10^{17}$ acceptors/cm$^3$ and most preferably between about $10^{18}$ acceptors/cm$^3$ and about $10^{21}$ acceptors/cm$^3$ is reached. For example, secondary ion mass spectroscopy (SIMS) can be used to determine the amount of dopant in the oxide film. Additionally, Hall measurements in combination with electrical resistivity measurements can be used to determine whether the oxide film is p-type or n-type, the net concentration of p-type or n-type carriers in the oxide film, to determine the Hall mobility of the carriers, and to determine the electrical resistivity of the oxide film. One skilled in the art will realize that the amount of dopant required in the powdered pellet may depend on numerous factors including operating conditions, distances from the target to the substrate, the size and shape of the chamber, as well as other variables during growth.

The concentration of p-type dopant may be varied within the p-type film by using more than one target and by selecting the target source during growth that yields the desired acceptor concentrations in the ZnO film. Such variations may be desirable in order to prepare surfaces onto which electrical leads may be attached that have desirable electrical properties.

Also in accordance with the present invention homoepitaxial and heteroepitaxial p-n junctions containing p-type doped ZnO films may be produced on suitable substrates such as gallium arsenide, sapphire and ZnO. It will be recognized by one skilled in the art that the terms "homoepitaxial" and "heteroepitaxial" are commonly used in the art interchangeably with "homostructural" and "heterostructural," respectively. The term "homostructural" is generally used when referring to structures wherein the materials have the same energy band gap and "heterostructural" is generally used when referring to structures wherein the materials have different energy band gaps.

The substrates may be doped with a p-type dopant to provide electrical contact to a p-n junction formed on the substrate. It will be recognized by one skilled in the art that an undoped substrate could also be used to grow a p-n junction on the undoped substrate. If the substrate is doped with a p-type dopant, such as zinc for a GaAs substrate for example, the p-type layer is deposited on the p-type substrate, and finally the n-type layer is deposited on the p-type layer. Similarly, if the substrate is n-type doped then the n-type layer is deposited first and then the p-type layer. Such configurations avoid any p-n junction formation between the substrate and the first deposited layer. The substrates are generally doped with a p or n type dopant to create at least about $10^{15}$/cm$^3$, more preferably at least about $10^{16}$/cm$^3$, still more preferably at least about $10^{17}$/cm$^3$ and most preferably between about $10^{18}$ and about $10^{21}$/cm$^3$. It will again be recognized by one skilled in the art that if an undoped substrate is used, either the p-type or n-type film can be first grown on the substrate.

To produce a homoepitaxial p-n junction, a p-type oxide layer is first grown on the substrate utilizing a pressed oxide powder pellet containing a p-type dopant such as arsenic as described above to obtain a net acceptor concentration of at least about $10^{15}$ acceptors/cm$^3$, more preferably at least about $10^{16}$ acceptors/cm$^3$, still more preferably at least about $10^{17}$ acceptors/cm$^3$, and most preferably between about $10^{18}$ acceptors/cm$^3$ and about $10^{21}$ acceptors/cm$^3$. The concentration of p-type dopant may be varied across the p-type film by using more than one target and by selecting the target source during growth that yields the desired acceptor carrier concentration in the oxide film. Such variations may be desirable in order to prepare surfaces onto which electrical leads may be attached that have desirable electrical properties.

To complete the homoepitaxial p-n junction, an n-type oxide film is grown on top of the p-type oxide film on top of the substrate. The n-type oxide film is grown on top of the p-type oxide film utilizing a pressed oxide powder pellet containing an n-type dopant such as aluminum, gallium, or indium as described above to yield an n-type film having a net donor concentration of at least about $10^{15}$ donors/cm$^3$, more preferably at least about $10^{16}$ donors/cm$^3$, more preferably at least about $10^{17}$ donors/cm$^3$, and most preferably between about $10^{18}$ donors/cm$^3$ and about $10^{21}$ donors/cm$^3$. As with the p-type film, the concentration level of the n-type carriers may be varied across the film by employing more than one target.

A heteroepitaxial p-n junction can also be produced in accordance with the present invention. To prepare a heteroepitaxial p-n junction, a p-type oxide film is grown on a suitable substrate as described above and a film containing an n-type dopant is grown on top of the p-type oxide film. In a heteroepitaxial p-n junction the values of the band gap energies of the p-type film and the n-type film are different. The n-type film, may be comprised of a oxide based material for which the value of the band gap energy has been changed by addition of suitable elements, or the n-type film may be another material such as zinc selenide or gallium nitride.

The use of heteroepitaxial p-n junctions prepared in accordance with the present invention provides additional materials for p-n junction and device fabrication so as to achieve an expanded range of band gap energies, increased optical tuning ranges, increased device lifetimes, more desirable processing parameters and conditions, as well as other advantages that will be recognized by one skilled in the art.

It will be recognized by one skilled in the art that, similar to the preparing of oxide films on a substrate, the preparation of homoepitaxial and heteroepitaxial p-n junctions can be accomplished using additional techniques in place of pulsed laser deposition. Other techniques include MBE, MBE with laser ablation, CVD, and MOCVD. It will also be recognized that devices having a more complex structure such as n-p-n transistors, p-n-p transistors, FETs, photodetectors, lattice matching layers, and layers on which electrical leads may be attached can easily be fabricated using the above-described techniques and processes.

In accordance with the present invention, p-type oxide material may be used as substrate material to reduce or eliminate problems associated with lattice mismatch. P-type oxide material that has a sufficiently high net acceptor concentration and low electrical resistivity can be used for forming electrical contacts with desirable properties on devices. For example, a template p-type oxide layer can be synthesized on two-compound semiconductor substrates such as GaAs. This template would provide a transition layer for growing epitaxial GaN-based materials with a density of defects that is lower than would occur in GaN films grown directly on GaAs.

The present invention is illustrated by the following example which is merely for the purpose of illustration and is not to be regarded as limiting the scope of the invention or manner in which it may be practiced.

EXAMPLE 1

In this example a ZnO film was synthesized on a gallium arsenide substrate and the film/substrate was annealed to diffuse p-type arsenic dopant from the substrate into the film to produce a p-type ZnO film on a gallium arsenide substrate.

A gallium arsenide substrate having the shape of a thin wafer and being about 1 centimeter by about 1 centimeter by about 0.05 centimeters was loaded into a pulsed laser deposition chamber, the temperature of the substrate set at 450° C., and the chamber filled with high purity hydrogen to a pressure of about 2 Torr. An iron shutter was inserted in front of the gallium arsenide substrate to create a separation distance of 4 centimeters between the substrate and the shutter. An argon fluoride excimer pulsed laser beam having an intensity of 50 mJ and a repetition rate of 20 Hz was directed at the metal shutter through a laser window and the shutter was illuminated for about 20 minutes to clean the substrate. Subsequently, the hydrogen was pumped out of the chamber, and the substrate temperature was decreased to about 300° C.

After the substrate was cleaned, the metal shutter was removed and a focusing lens was inserted in front of the laser window to focus the laser beam. The polycrystalline ZnO target was pre-ablated with the excimer pulsed laser beam which was operating at an intensity of about 50 mJ and having a repetition of about 20 Hz for a period of about 10 minutes. High purity oxygen gas was then introduced into the chamber to create a pressure of about 35 mTorr.

The excimer pulsed laser beam, operating at an intensity of about 90 mJ and a repetition of about 20 Hz, was then directed at the polycrystalline ZnO for a period of about 2 hours to grow a ZnO film having a thickness of about 1.0 micrometers on the substrate.

After the film growth, the oxygen gas pressure in the chamber was adjusted to about 2 Torr, and the temperature of the substrate is increased to about 500° C. The film/substrate was annealed for about 30 minutes to diffuse arsenic atoms from the substrate into the ZnO film. The annealing created an arsenic doped p-type ZnO film on the gallium arsenide substrate.

Figure 2:
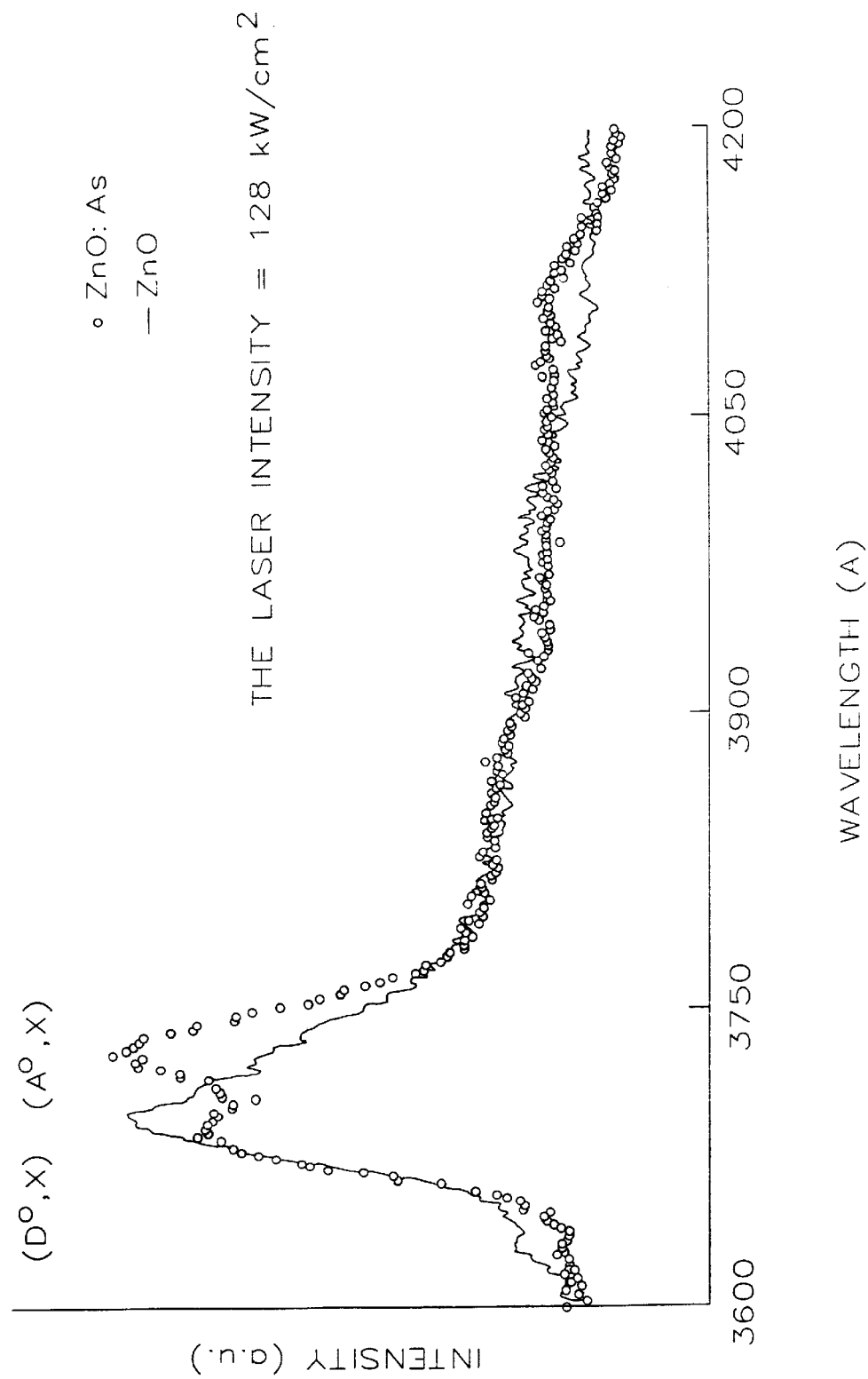
FIG. 2 is a photoluminescence spectra at 20° K. of a ZnO film and an arsenic-doped ZnO film prepared in accordance with the present invention.

FIG. 2 shows a photoluminescence spectra at 20° K. of the ZnO film (solid line) and the arsenic-doped ZnO film (dots) prepared in this Example. The pumping excitation is from a pulsed nitrogen laser with a power density of 128 kW/cm$^2$. The spectra shows that for the ZnO film the donor-bound excitonic peaks located at about 3.36 eV (3698 angstroms) are dominant. However, the arsenic doped ZnO film of the present example shows that the acceptor-bound excitonic peak located at about 3.32 eV (3742 angstroms) is the strongest peak. This feature of acceptor-bound excitonic peaks indicates that the acceptor density is greatly increased with arsenic doping, and the ZnO film becomes p-type.

Figure 3:
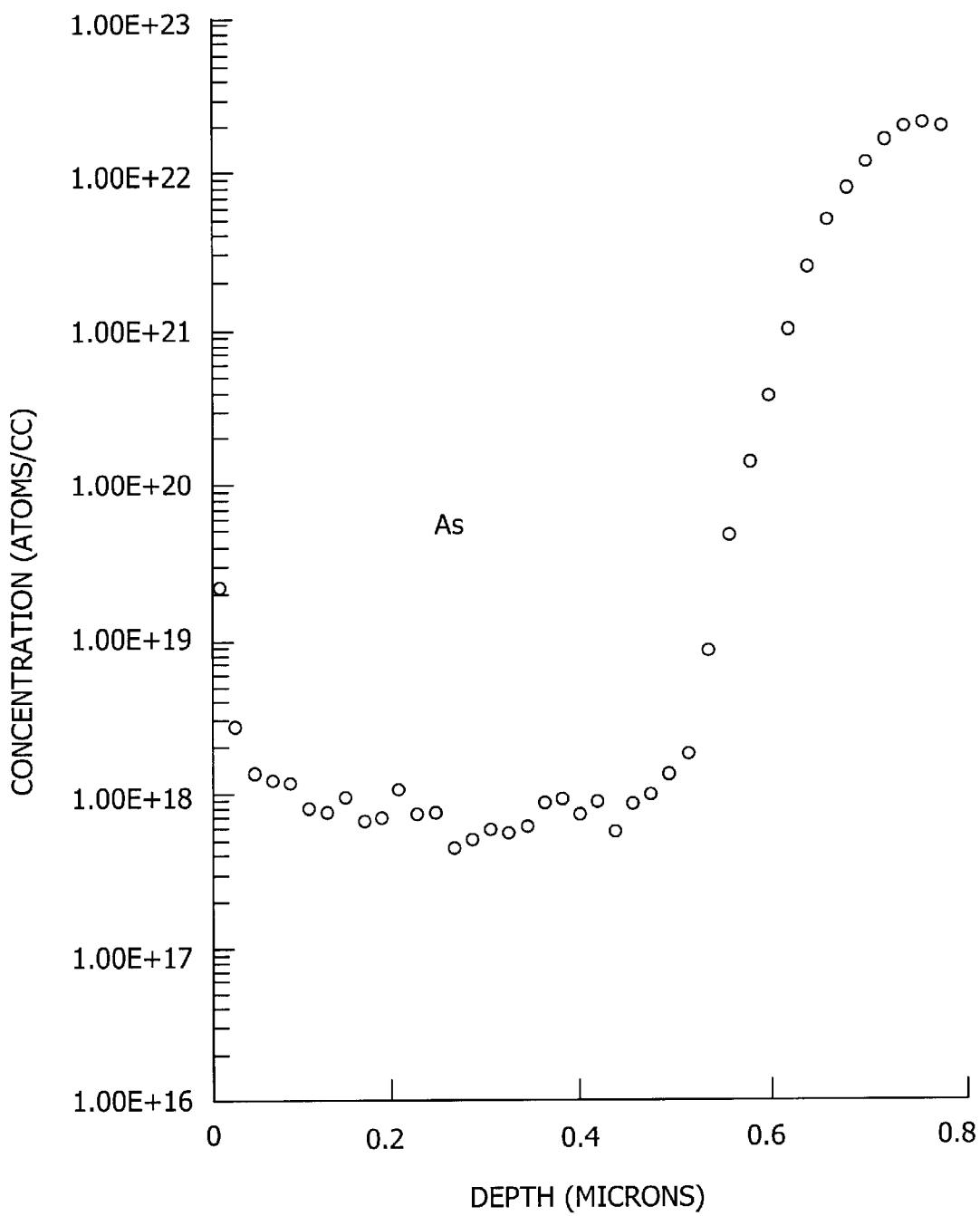
FIG. 3 is a Secondary Ion Mass Spectroscopy (SIMS) plot of an arsenic doped ZnO film prepared in accordance with the present invention.

FIG. 3 shows a Secondary Ion Mass Spectroscopy (SIMS) plot of the arsenic doped ZnO film prepared in this Example. The plot shows the concentration in atoms/cm$^3$ of arsenic as a function of depth from the surface of the arsenic doped ZnO film. This plot shows that the arsenic concentration is about $10^{18}$ atoms/cm$^3$ to about $10^{21}$ atoms/cm$^3$ throughout the film.

EXAMPLE 2

Figure 10:
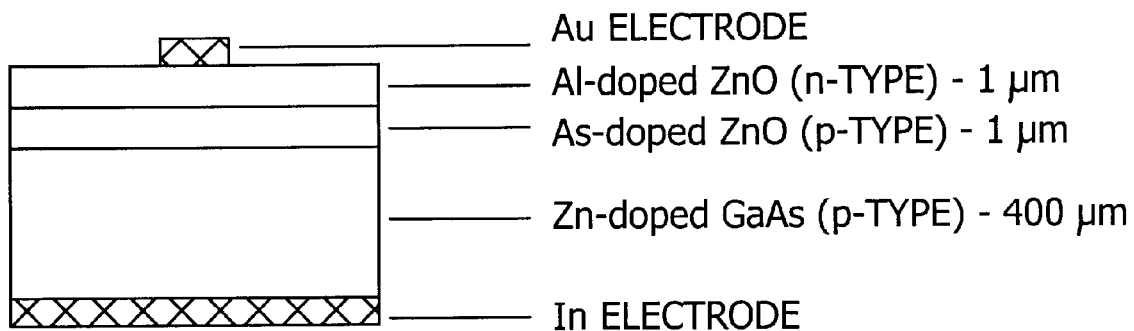
FIG. 10 is a schematic diagram of a p-n junction.

In this example a p-n junction, such as the p-n junction shown in FIG. 10, was synthesized utilizing p-type and n-type ZnO material on a zinc doped gallium arsenide substrate. The electrical properties of the p-n junction were measured and electrical data gathered to demonstrate that the device fabricated shows p-n junction behavior.

A zinc doped (0001) gallium arsenide substrate having the shape of a thin wafer and being about 1 centimeter by about 1 centimeter by about 0.05 centimeters was loaded into a pulsed laser deposition chamber. To clean the substrate the temperature of the substrate was set at 450° C., and the chamber filled with high purity hydrogen gas to create a pressure of about 2 Torr. An iron shutter was inserted in front of the gallium arsenide substrate to create a separation distance of about 4 centimeters between the substrate and the shutter. An argon fluoride excimer pulsed laser beam having an intensity of about 50 mJ and a repetition rate of about 20 Hz was directed at the metal shutter through a laser window (in the absence of a focusing lens) and the shutter was illuminated for about 20 minutes to clean the substrate. Subsequently, the hydrogen was pumped out of the chamber, and the temperature of the substrate in the chamber was lowered to about 400° C. in preparation for film growth.

After the substrate was cleaned, a focusing lens was inserted in front of the laser window to focus the laser beam onto the polycrystalline ZnO target. The polycrystalline ZnO target was pre-ablated with the excimer pulsed laser beam which was operating at an intensity of about 50 mJ and having a repetition of about 20 Hz for a period of about 10 minutes. The metal shutter was in place between the target and the substrate to protect the substrate from contamination during preablation. After the pre-ablation was completed, the metal shutter was removed and high purity oxygen was introduced as an ambient gas to create a pressure of about 40 mTorr during p-type film growth.

The excimer pulsed laser beam, operating at an intensity of about 90 mJ and a repetition of about 20 Hz, was then directed at the polycrystalline ZnO for a period of about 2 hours to grow a ZnO film having a thickness of about 1.5 micrometers on the substrate. The separation distance between the substrate and the target was about 7 cm. After the laser beam was shut off, the substrate temperature was adjusted to about 450° C. and held for 20 minutes in an ambient gas pressure of about 40 mTorr. Finally, the temperature was decreased to about 350° C., and the n-type layer growth steps initiated.

For growth of the n-type layer on top of the p-type layer, the target was replaced with an alloy of ZnO and aluminum oxide ($Al_2O_3$) wherein the $Al_2O_3$ was about 2% by atomic weight. The metal shutter was placed between the target and the substrate, the temperature of the substrate adjusted to about 350° C., and the oxygen pressure adjusted to 40 mTorr. The laser was operating at an intensity of 50 mJ and a repetition rate of 20 Hz. The target was pre-ablated for a period of 20 minutes.

After pre-ablation, the metal shutter was removed and the laser beam adjusted to an intensity of 90 mJ with a repetition rate of 20 Hz and was focused on the alloy target for a period of about 2 hours to grow a film having a thickness of about 1.5 micrometers. The distance between the target and the substrate was about 7 cm. After growth, the laser beam was shut off and the substrate having the p-type and n-type layer cooled to room temperature.

FIG. 6 shows electrical properties of an n-type layer of an aluminum doped ZnO film grown on an undoped GaAs substrate utilizing the same process described for growth of the n-type ZnO layer in Example 2. The data is presented over a range of magnetic fields from 1001 Gauss to 5004 Gauss as shown in the Field column at a temperature of about 290 Kelvin. The Hall Coefficient values are negative values throughout the entire Gauss range indicating that the net carrier concentration is negative and the material is n-type. The resistivity values are low and indicate that the n-type film has electrical conductivity properties sufficient for use in the fabrication of electrical devices. The carrier density values are negative indicating the film is n-type. Also, these values are above $10^{18}$ cm$^{-3}$ which indicate that the carrier concentration is sufficient for use in electrical devices. Finally, the Mobility values are all negative and near the value of 1 cm$^2$/volt-sec and indicate the film is n-type and has carrier mobility properties sufficient for fabrication of electrical devices.

Figure 7:
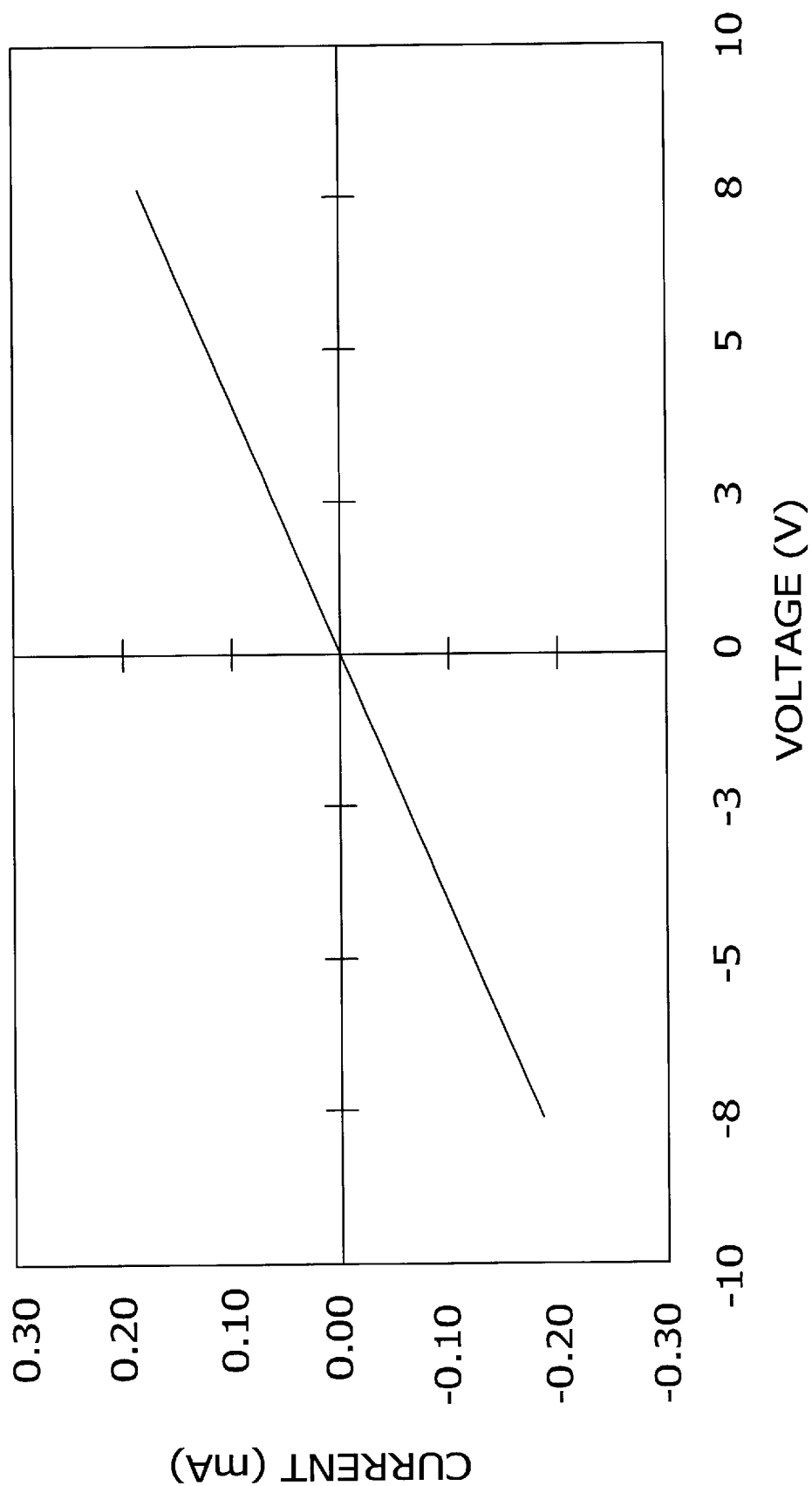
FIG. 7 is a current voltage measurement made on an aluminum doped ZnO n-type film.

FIG. 7 shows a current-voltage measurement made on the aluminum doped ZnO film. FIG. 7 shows that the electrical current versus applied voltage approximates a straight line from about 8 volts negative to about 8 volts positive (centered about zero) which demonstrates that the electrical behavior is that of an ohmic material and not a p-n junction device which would display rectifying behavior.

Figure 8:
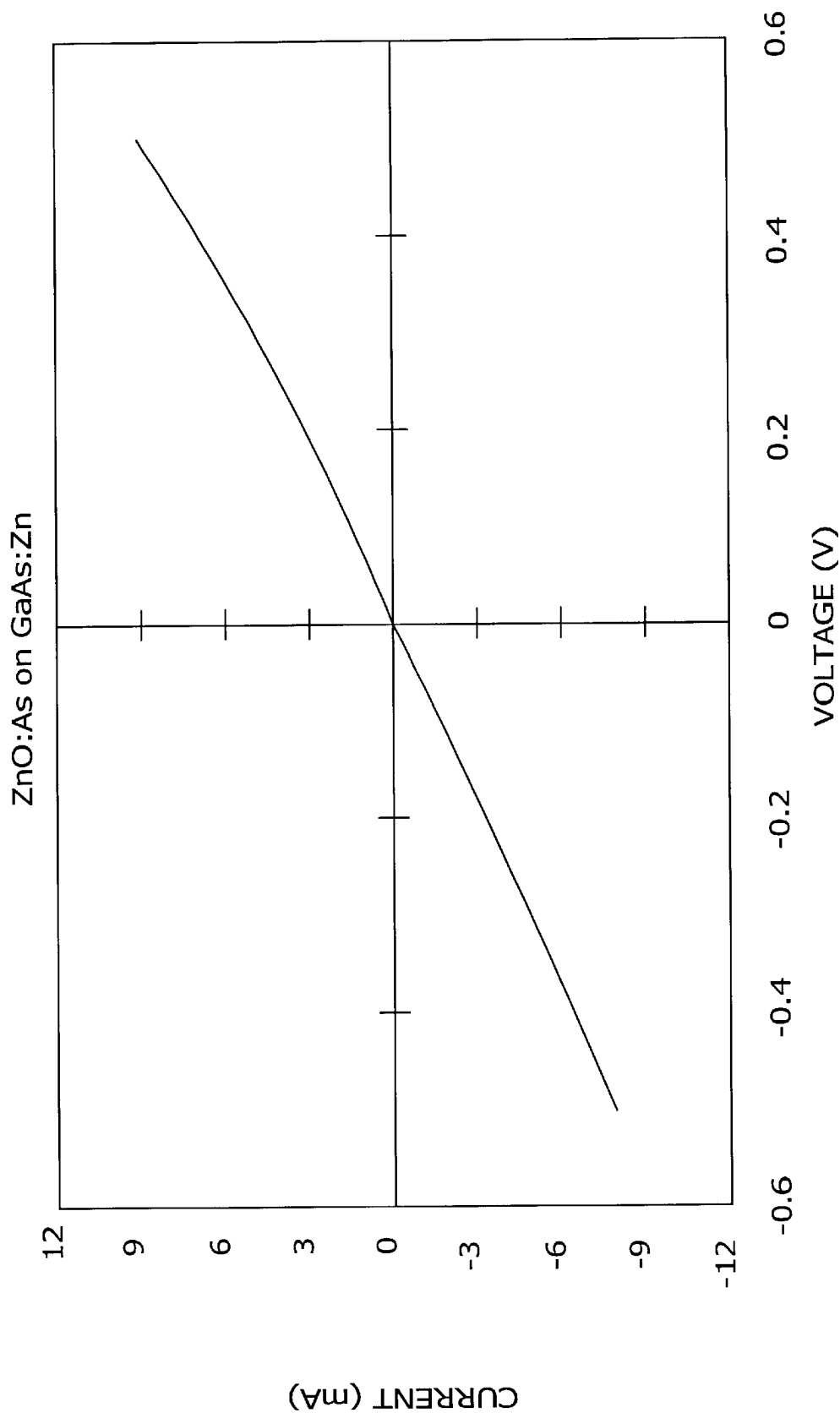
FIG. 8 is a current voltage measurement made on an arsenic doped ZnO p-type film.

FIG. 8 shows a current-voltage measurement made on an arsenic doped ZnO film grown on zinc doped GaAs substrate using the same process as described for growth of the p-type ZnO layer in Example 1. FIG. 8 shows that the electrical current versus applied voltage approximates a straight line from about 0.8 volts negative to about 0.8 volts positive (centered about zero) which demonstrates that the electrical behavior is that of an ohmic material and not a p-n junction device. It will be recognized by one skilled in the art that for p-type material in contact with p-type material it is sufficient to measure current versus applied voltage in a more restricted range to demonstrate ohmic behavior.

Figure 9:
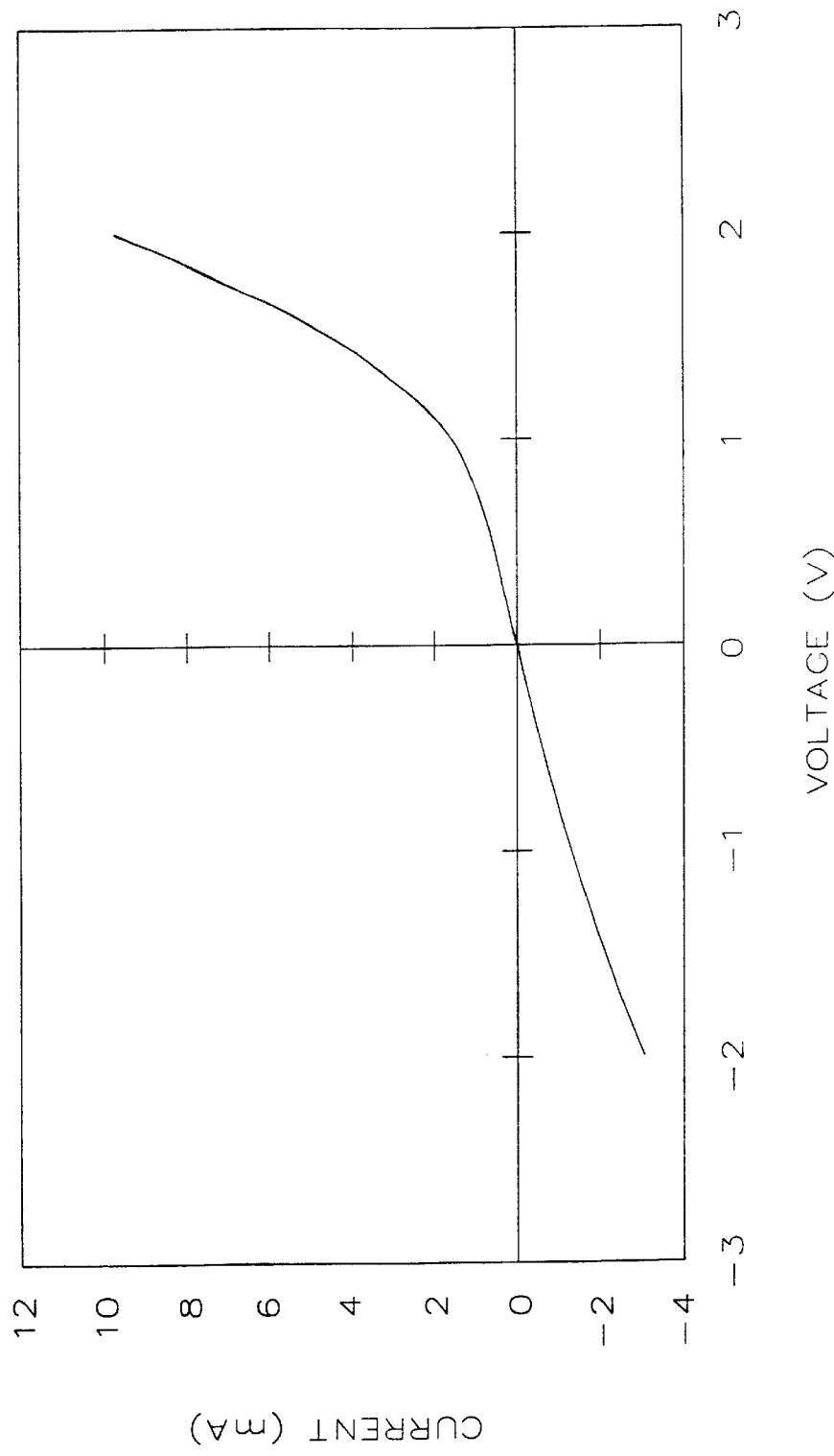
FIG. 9 is a current voltage measurement made on a p-n junction.

FIG. 9 shows a current-voltage measurement on the entire p-n junction of Example 2. The fact that the electrical current versus applied voltage rises above a straight line for applied voltages greater than 1 volt positive for this device and the fact that the electrical current versus applied voltage approximates a straight line for applied voltages to about 2 volts negative demonstrates that the electrical behavior of the device does not display the behavior of an ohmic material and does display the electrical characteristics of a rectifying device and a p-n junction.

In view of the above, it will be seen that the several objects of the invention are achieved.

As various changes could be made in the above-described process for preparing p-type ZnO films without departing from the scope of the invention, it is intended that all matter contained in the above description be interpreted as illustrative and not in a limiting sense.

What is claimed is:

1. A ZnO film on a substrate, the ZnO film containing a p-type dopant having a net acceptor concentration of at least about $10^{15}$ acceptors/cm$^3$, a resistivity no greater than about 1 ohm-cm, and a Hall Mobility of between about 0.1 and about 50 cm$^2$/Vs, wherein the substrate is sapphire.

2. A ZnO film on a substrate, the ZnO film containing a p-type dopant and having a net acceptor concentration of at least about $10^{15}$ acceptors/cm$^3$, a resistivity no greater than about 1 ohm-cm, and a Hall Mobility of between about 0.1 and about 50 cm$^2$/Vs, wherein the substrate is ZnO.

3. The ZnO film on the substrate of claim 1 wherein the ZnO film and substrate are incorporated into a transducer diode.

4. An oxide film on a substrate, the oxide film containing a p-type dopant and having a net acceptor concentration of at least about $10^{15}$ acceptors/cm$^3$, a resistivity no greater than about 1 ohm-cm, and a Hall Mobility of between about 0.1 and about 50 cm$^2$/Vs.

5. The film as set forth in claim 4 wherein the net acceptor concentration is between about $10^{18}$ acceptors/cm$^3$ and about $10^{21}$ acceptors/cm$^3$, the resistivity is between about 1 ohm-cm and about $10^{-4}$ ohm-cm, and the Hall Mobility is between about 0.1 and about 50 cm$^2$/Vs.

6. The film as set forth in claim 4 wherein the net acceptor concentration is at least about $10^{16}$ acceptors/cm$^3$, the resistivity is between about 1 ohm-cm and about $10^{-4}$ ohm-cm, and the Hall Mobility is between about 0.1 and about 50 cm$^2$/Vs.

7. The film as set forth in claim 4 wherein the p-type film has a thickness of between about 0.5 and about 3 micrometers.

8. The film as set forth in claim 4 wherein the p-type dopant is arsenic.

9. The film as set forth in claim 4 wherein the film is a zinc oxide film.

10. The film as set forth in claim 4 wherein the film is a magnesium oxide film.

11. The film as set forth in claim 4 wherein the film is a cadmium oxide film.

12. The film as set forth in claim 4 wherein the film is an oxide compound of an element selected from the groups consisting of Group 2, Group 12, Group 2 and Group 12, and Group 12 and Group 16 elements.

13. The film as set forth in claim 4 wherein the p-type dopant is an element selected from the groups consisting of Group 1, Group 11, Group 5, and Group 15 elements.

* * * * *